United States Patent [19]

Maraio et al.

[11] Patent Number: 5,136,248
[45] Date of Patent: Aug. 4, 1992

[54] METHOD AND DETECTOR FOR IDENTIFYING INSULATOR FLASHOVER

[75] Inventors: Robert A. Maraio, Cammillus, N.Y.; Andrew T. McMahon, Colorado, Colo.; Herbert B. Hart, Jr., Liverpool, N.Y.

[73] Assignee: Niagara Mohawk Power Corporation, Syracuse, N.Y.

[21] Appl. No.: 471,591

[22] Filed: Jan. 29, 1990

[51] Int. Cl.$^5$ ............................................. G01R 31/02
[52] U.S. Cl. ..................................... 324/536; 324/551
[58] Field of Search ............... 324/521, 522, 529, 536, 324/541, 544, 551

[56] References Cited

U.S. PATENT DOCUMENTS

| | | |
|---|---|---|
| 1,893,337 | 1/1933 | Patterson . |
| 3,156,866 | 11/1964 | Anderson et al. ............... 324/72 |
| 3,707,674 | 12/1972 | Bahder et al. ............... 324/536 |
| 4,112,357 | 9/1978 | Livermore ............... 324/72 |
| 4,112,475 | 9/1978 | Stitt et al. ............... 361/33 |
| 4,385,271 | 5/1983 | Kurtz et al. ............... 324/536 |
| 4,458,198 | 7/1984 | Schweitzer, Jr. ............... 324/529 |
| 4,897,607 | 1/1990 | Grünewald et al. ............... 324/536 |

FOREIGN PATENT DOCUMENTS

| | | |
|---|---|---|
| 155771 | 9/1984 | Japan . |
| 59-197871 | 11/1984 | Japan . |
| 59-202072 | 11/1984 | Japan . |
| 222028 | 12/1984 | Japan . |
| 61-3075 | 1/1986 | Japan . |
| 61-35370 | 2/1986 | Japan . |
| 138474 | 5/1989 | Japan ............... 324/521 |
| 1208642 | 10/1970 | United Kingdom . |
| 1374700 | 11/1974 | United Kingdom . |

OTHER PUBLICATIONS

J. G. Anderson, EPRI Transmission Line Reference Book, 345 KV and Above, Chapter 12 "Lightning Performance of Transmission Lines", pp. 545-557, 1987.

M. P. Perry, J. M. Houston, "Fault Location in SF6 Insulated Conductors Using Direct Fluxgate Magnetometry", IEEE Transactions on Power Apparatus & Systems, vol. PAS-102, No. 2, Feb. 1983, pp. 312-314.

Primary Examiner—Kenneth A. Wieder
Assistant Examiner—Maura K. Regan
Attorney, Agent, or Firm—Heslin & Rothenberg

[57] ABSTRACT

A method and detector for monitoring electrical strikes along a power transmission distribution system are described. The method and detector identify the location within the transmission system where an insulator flashover event has occurred. The method includes sensing the magnetic field about the live transmission line(s) upstream and downstream from each transmission tower and providing signals representative of the upstream and downstream magnetic fields. These signals are then compared and a flashover event signal is provided whenever the signals representative of the magnetic fields differ about a tower. The event signal identifies the tower within the system on which the insulator flashover occurred. A detector corresponding to the method is also provided.

15 Claims, 3 Drawing Sheets

METHOD AND DETECTOR FOR IDENTIFYING INSULATOR FLASHOVER

BACKGROUND OF THE INVENTION

1. Technical Field

The present invention relates to an improved method and detector for monitoring electrical strikes along a power transmission distribution system and, more particularly, to a method and detector which will identify the location within the power transmission system where an insulator flashover event has occurred.

2. Description of the Prior Art

Electrical power transmission lines are commonly suspended from grounded metal towers by means of non-conducting insulator assemblies. The insulators are designed to prevent electrical current flowing from the transmission line(s) to the supporting metallic towers. When a current flows between a transmission line and the grounded tower across an insulator, the phenomenon may be a relatively short duration spark (e.g., microseconds), or a relatively long duration arc (e.g., milliseconds); such phenomenon are referred to in the art as a flashover. Depending upon the length and intensity of the flashover, damage may occur to the insulator. Even if no visible indication of damage is apparent, such as carbon deposits or other discoloration, the insulator may have been weakened by the flashover event such that servicing and/or replacement thereof is desirable. Principal causes of insulator flashovers are transient power surges resulting from, for example, lightning striking the transmission line or the tower.

Traditionally, locating a transmission tower on which insulator flashover occurred has required manual examination of each insulator, or insulator string, positioned on each tower within the system for visual signs of flashover breakdown. In addition to its obvious time-consuming and labor-intensive nature, this approach is inherently unreliable. As noted, a momentary flashover event may result in no obvious visual damage or weakening of an insulator, in which case manual inspection of each tower could fail to identify the location of the flashover event.

The known art contains at least one attempt to provide a mechanical insulator flashover detector. Japanese patent application disclosure S.59-155771, entitled: "Flash Short Circuiting Display Device," describes apparatus designed to facilitate the discovery of cloud-to-ground discharge events which is characterized by a coil that detects a magnetic flux created by a surge current and that induces a corresponding output voltage. The output voltage is compared with a standard voltage for the transmission line and a display signal is provided whenever the output voltage deviates from the standard voltage. Although somewhat more useful than the manual inspection approach, this "threshold type" detector appears to have a significant drawback in that multiple flashover event signals may be generated along a power transmission system for a single transient power surge. A power surge may travel a significant distance within the system before finally being dissipated. Anytime the magnetic field about the transmission line comparatively varies from the stored reference value then a flashover event signal would be given.

Thus, there appears to exist a geniune need in the art for a more precise approach to the identification and locating of an insulator flashover event caused by a transient power surge, such as that experienced when lightning strikes the power transmission system.

SUMMARY OF THE INVENTION

The primary object of the present invention is to provide a method and a detector capable of identifying the occurrence of an insulator flashover event within a power transmission system.

More specifically, a further object of the present invention is to provide such a method and detector which are capable of locating the transmission tower on which an insulator flashover event occurred.

Another object of the present invention is to provide such a method and detector which are reliable and inexpensive to implement.

The foregoing and other objects are accomplished in accordance with the present invention in a first aspect by the provision of an insulator flashover identifying method for use with a power transmission system including at least one live transmission line supported by at least one transmission tower. The method includes: sensing the magnetic field about the live transmission line upstream and downstream from the transmission tower; providing signals representative of each of the upstream and downstream magnetic fields; and, comparing the signals representative of the upstream and downstream magnetic fields and providing a flashover event signal whenever the signals representative of the magnetic fields differ, the event signal being characteristic of an insulator flashover on the at least one transmission tower. Assuming that the power transmission system includes multiple transmission line support towers then the method includes sensing the magnetic field about the at least one live transmission line upstream and downstream from each of the transmission towers; and, comparing the signals representative of the upstream and downstream magnetic fields about each tower and providing a flashover event signal whenever a particular pair of signals representative of the upstream and downstream magnetic fields differ about a particular tower such that the event signal identifies the tower within the transmission system on which the insulator flashover event occurred.

In another aspect, a flashover event detector is provided for use with such a power transmission system. The detector includes sensors which are positionable about the at least one live transmission line upstream and downstream from each transmission tower and which are capable of providing signals representative of the upstream and downstream magnetic fields about the towers. Comparing means are also provided for determining when the signals representative of the upstream and downstream magnetic fields differ about a particular tower, along with providing means for signaling the occurrence of a flashover event whenever the fields differ. Again, the event signal is characteristic of an insulator flashover at the particular transmission tower about which the magnetic fields differ.

BRIEF DESCRIPTION OF THE DRAWINGS

The subject matter which is regarded as the invention is particularly pointed out and distinctly claimed in the concluding portion of the specification. The invention, however, both as to organization and method of practice, together with further objects and advantages thereof, may best be understood by reference to the following description taken in conjunction with the accompanying drawings in which:

DETAILED DESCRIPTION OF THE INVENTION

Figure 1A:
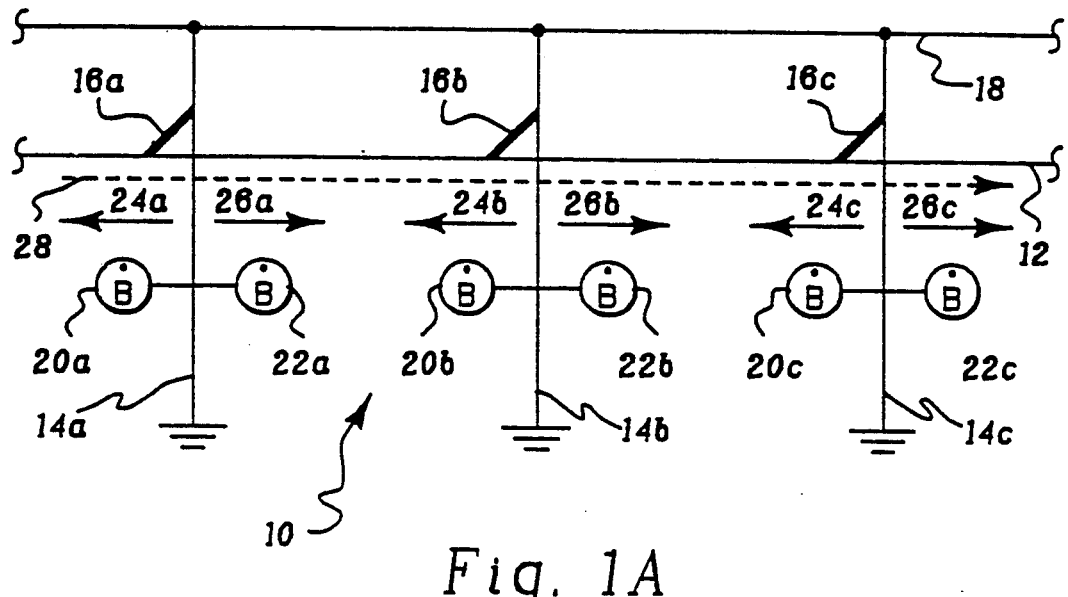
FIGS. 1A and 1B depict a power transmission system and current flow therethrough under normal condition and insulator flashover condition, respectively.

During normal operation of a power transmission system, including either single phase or three phase transmission lines, power flow and current flow is in one direction. Consequently, the 60 Hz magnetic fields both "upstream" and "downstream" from a given transmission line tower are equal. This is depicted in FIG. 1A, where transmission system 10 includes at least one phase line 12 (multiple phase lines could be horizontally located behind line 12), multiple support towers, e.g., towers 14a, 14b and 14c, insulators 16a, 16b and 16c, and at least one overhead ground wire 18. As shown, each tower 14a, 14b and 14c is grounded and ground wire 18 interconnects the towers of system 10. During normal operation power and current flow in phase line 12 is shown from left to right for purposes of illustration only, as depicted by dotted line 28.

Pursuant to the present invention, and as also shown in FIG. 1A, magnetic field sensors 20a, 22a, 20b, 22b and 20c, 22c are positioned about the "upstream" 24a, 24b and 24c and the downstream 26a, 26b and 26c sides of towers 14a, 14b and 14c, respectively. Each sensor comprises, for example, an electrostatically shielded loop antenna which may be purchased or manufactured from readily available components. In one embodiment, the loop antenna consists of 30 turns of RG-58 coaxial cable configured with a diameter of approximately 15 centimeters. The sensors operate such that the induced voltage in the antenna feed is directly proportional to incident magnetic field strength about the live transmission line. Sensors 20a-20c and 22a-22c are oriented such that the longitudinal axis of the loop is aligned with the dominant component of the 60 Hz magnetic field associated with the live transmission line. Normally, this would be in the vertical direction. The sensors are placed upstream and downstream of the tower at approximately the same location with respect to the tower and the phase line (e.g., 2-3 meters). Each sensor is connected via RG-58 coaxial cable to the detector circuitry (discussed below) which is housed in a box at the base of each tower. The coaxial cable is attached to the circuit box with BNC connectors. Sensors 20a-20c and 22a-22c are shown located below line 12 for ease of installation only. This location is preferred since the detector could be manually installed without powering down transmission system 10.

Figure 1B:
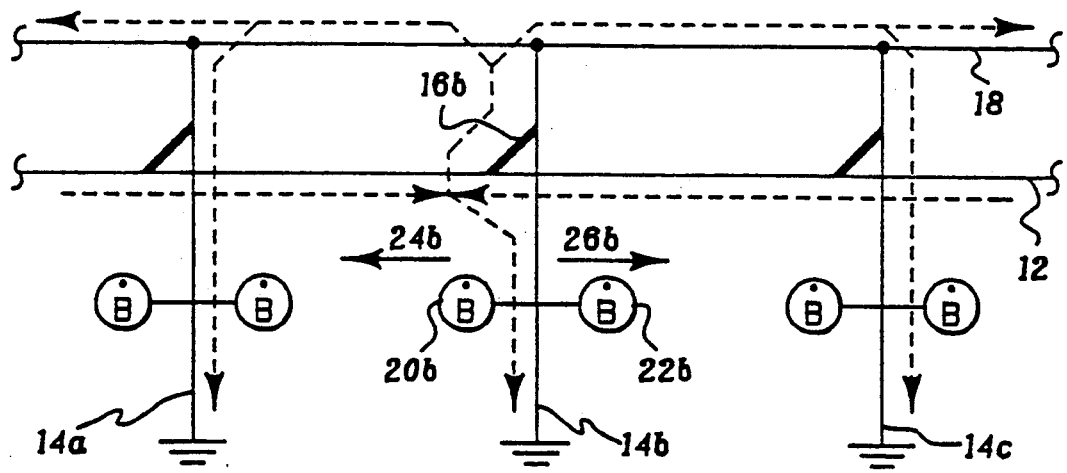

When flashover of an insulator occurs, one phase line of the transmission system is grounded and current flow on both the upstream and downstream lines is towards the tower and insulator that experienced the flashover. Thus, the magnitude and direction of the upstream and downstream currents are not equal and consequently the AC magnetic fields are no longer equal. This principal is advantageously used by the method and detector claimed herein. In FIG. 1B, the flashover event is depicted as occurring on transmission tower 14b. As shown, current flow on both the upstream side 24b and downstream side 26b of tower 14b is towards the tower and hence to ground across insulator 16b through tower 14b or ground wire 18. Thus, sensors 20b and 22b on tower 14b measure a relative difference in magnetic field strength and direction. This difference is used in the present invention to drive a flashover event indicator. The sensors on towers 14a and 14c do not measure a relative difference in magnetic field strength or direction, and consequently the indicators thereon are not activated. This is true notwithstanding that the current flow in phase line 12 at tower 14c has reversed to now flow right to left as illustrated.

Thus, in general, the method of the present invention includes: sensing the magnetic field about line 12 both upstream and downstream of each transmission tower 14a, 14b, 14c, etc. and providing output signals representative thereof; comparing the output signals representative of the magnetic fields about each transmission tower and providing an indication whenever a magnetic field differential exists about the tower. The event signal is indicative of an insulator flashover event occurring on the particular transmission tower, which thereby facilitates identification, inspection and/or replacement of the insulator which experienced the flashover event.

Figure 2:
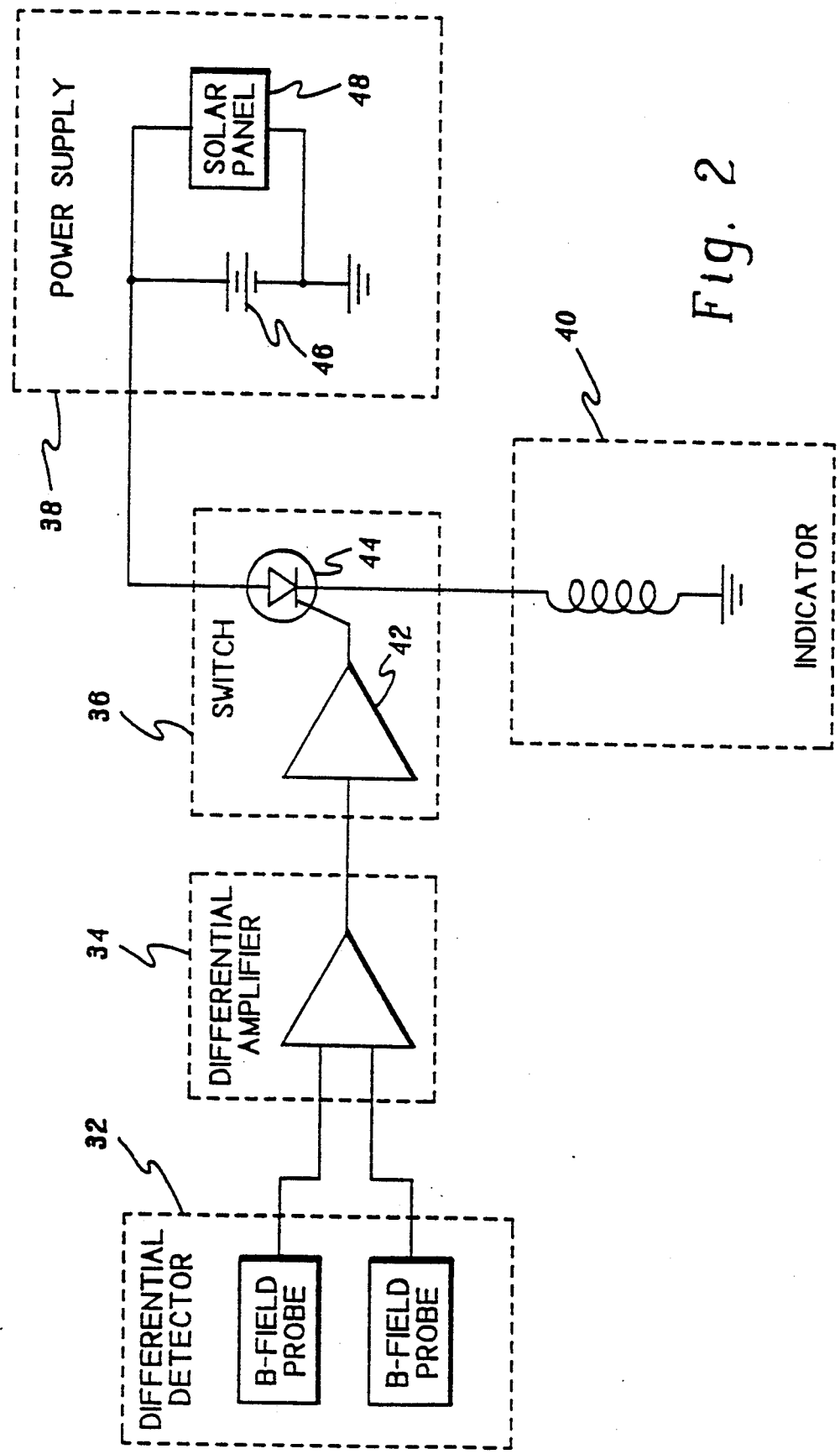
FIG. 2 is a schematic illustration of one embodiment of the detector of the present invention.

One embodiment of the insulator flashover detector of the present invention is set forth in FIG. 2. In this embodiment, a detector unit is installed at each tower within the power transmission system. As shown, the principal components of the detector include a differential detector 32, a differential amplifier 34, a switch 36, a power supply 38 and an indicator 40. Differential detector 32 comprises the two magnetic field sensors or probes positioned about the tower upstream and downstream thereof. Differential amplifier 34 is configured to output a signal whenever there is a difference in magnitude and direction of the magnetic fields sensed about the tower. The output from amplifier 34 is fed to switch 36 which includes a comparator 42 and a silicon controlled rectifier (SCR) 44, which are discussed below. Switch 36 is designed to activate indicator 40 whenever a sufficient differential signal is outputted from amplifier 34. Indicator 40 can comprise any commercially available signaling means, including visual or electronic signaling devices. The indicator is driven by a power supply 38, which in the embodiment described herein comprises a 9-volt nickel cadmium battery 46 capable of being recharged during the day by a commercially available 9-volt solar panel 48. Such a supply 38 configuration, and others, can be readily implemented by those skilled in the art.

Figure 3:
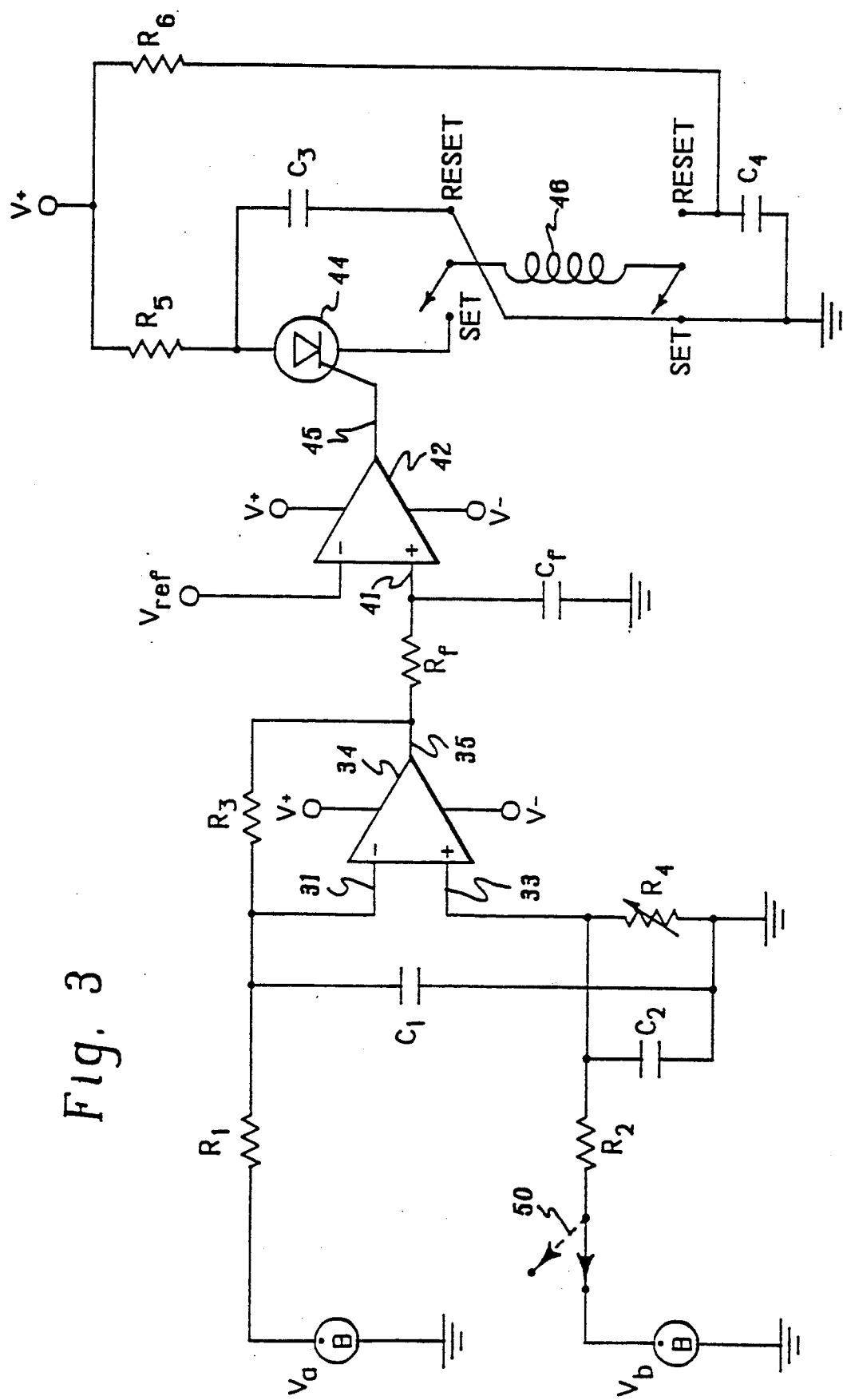
FIG. 3 is a more detailed schematic representation of the detector depicted in FIG. 2.

Amplifier 34, switch 36 and indicator 40 circuitry are shown in greater detail in FIG. 3. Outputs from the two magnetic field sensors on the transmission tower are fed to differential amplifier 34 as $V_a$ and $V_b$ (field direction being accounted for by ± voltages). As noted, amplifier 34, e.g., type OP-220, is configured to amplify the difference between the two input signals $V_a$ and $V_b$. Resistances $R_1$ and $R_3$ and $R_2$ and $R_4$ serve to step up signals $V_a$ and $V_b$ at input terminals 31 and 33 of amplifier 34. The variable resistor $R_4$ is provided in the gain circuitry of $V_b$ in order to null out voltages $V_a$ and $V_b$ under standard operating conditions. The different gain is necessary principally due to the difficulty in locating the two sensors at exactly the same position relative to the tower and the phase line. Under normal operating conditions, a substantially zero voltage should appear at the output 35 of differential amplifier 34. Preferably, capacitors $C_1$ and $C_2$, configured as a low-pass filter, are also provided at the input to amplifier 34 to limit the possibility of a false signal being generated due to a momentary power surge, for example, resulting from switching of a breaker within the transmission system.

Another low-pass filter, formed by $R_f$ and $C_f$, is disposed between output 35 of amplifier 34 and input 41 of amplifier 42. This low-pass filter is also designed to prevent the occurrence of a false insulator flashover signal, for example, due to slight differentials between the magnetic fields about the transmission tower. The second amplifier 42, e.g., type OP-220, compares input 41 of amplifier 42, with a pre-selected reference voltage $V_{ref}$. If input voltage 41 is less than reference voltage $V_{ref}$ then the output 45 of comparator 42 is low. If, on the other hand, the input voltage 41 of amplifier 42 is greater than reference voltage $V_{ref}$, output 45 of the comparator is high. The two operational amplifiers are housed in a single dual-inline package (DIP) and are specifically selected for their low current consumption. Such an assembly is manufactured by PMI of Santa Clara, Calif. and marketed as part number OP-220.

Output 45 of comparator 42 is connected to the gate of SCR 44. The anode of the SCR is connected to a charged capacitor $C_3$ and the cathode of the SCR is connected to indicator 40. In one embodiment, indicator 40 comprises a magnetic disk indicator such as that manufactured by Ferranti-Packard in Mississauga, Ontario, Canada and sold as part number 30 NR. When the SCR gate voltage is low, no current is allowed to flow from the anode to the cathode. However, when the gate voltage momentarily goes high, current flows through the SCR from the anode to the cathode from the discharging parallel capacitor $C_3$. (Resistances $R_5$ and $R_6$ are chosen sufficiently high that substantially no current flows to SCR 44 directly from power supply 38, i.e., V+.) This current flow is sufficient to flip the disk of the magnetic disk indicator from a non-event signal to an event signal, e.g., from black to red. Once flipped, the disk is held in place by remnant magnetism, and current flow through SCR 44 is stopped with the discharge of capacitor $C_3$. A double pole double throw (DPDT) reset switch is included in the circuitry as shown. When the reset is depressed, a second capacitor $C_4$ is discharged in a reverse direction through magnetic disk indicator 40 causing the disk to flip from red to black. The reset circuitry is configured such that it cannot cause the disk indicator to flip from black to red.

As an enhanced feature, a single pole single throw (SPST) test switch 50 is connected in series with the input from one of the magnetic field sensors. When switch 50 is depressed, current is interrupted in the sensor input and the differential amplifier 34 magnifies the input voltage of the second sensor. This causes the comparator to go high, the SCR to trigger, and the magnetic disk indicator to flip from black to red.

Proper installation and adjustment of the flashover detector is important for optimum performance. The two magnetic field sensors should be placed as close to the phase lines as possible. Additionally, they should be displaced two or three meters horizontally from the insulator on either side of the tower and positioned as symmetrically as possible so that magnetic field strengths at each sensor are nearly equal under normal operating conditions. It is also important that the two sensors be oriented with the polarity indicator on each sensor pointing in the same direction. If the polarity of one indicator is reversed, then the induced voltages in the two sensors will be 180° out of phase, and proper circuit adjustment will not be possible.

While the invention has been described in detail herein in accordance with certain preferred embodiments thereof, many modifications and changes therein may be affected by those skilled in the art. For example, instead of isolated detectors (and signaling means) on the towers of the transmission system, insulator flashover event signals could be electronically forwarded to a central control station for viewing. Accordingly, it is intended by the appended claims to cover all such modifications and changes as fall within the true spirit and scope of the invention.

What is claimed is:

1. A method for identifying insulator flashover within a power transmission system including at least one live transmission line transversely supported by at least one transmission tower and an insulator interposed between said live line and said tower at each place of support, said method comprising:

sensing the magnetic field about the live transmission line upstream from the at least one transmission tower about an in-coming portion of said live line and downstream from the at least one transmission tower about an out-going portion of said live line to ascertain at least one of the amplitude and phase of the magnetic field about the live line on both the upstream and downstream sides of the transmission tower;

providing signals representative of said ascertained amplitude and/or phase of said magnetic fields upstream and downstream from the transmission tower; and comparing said signals representative of said magnetic fields upstream and downstream from the transmission tower and providing a flashover event signal whenever said signals representative of said amplitude and/or phase of said magnetic fields differ, said event signal being characteristic of insulator flashover on the transmission tower transversely supporting said at least one live transmission line.

2. The insulator flashover identifying method of claim 1, wherein said sensing step includes sensing the amplitude and/or phase of the magnetic field about the live transmission line on both the upstream and downstream sides of the transmission tower proximate to said transmission tower.

3. The insulator flashover identifying method of claim 1, wherein said at least one live transmission line is transversely supported by a plurality of transmission towers and said method includes:

sensing the amplitude and/or phase of the magnetic field about the at least one live transmission line on both the upstream and downstream sides of each of said transmission towers; and comparing the signals representative of said sensed amplitude and/or phase of said magnetic fields on the upstream and downstream sides of each transmission tower and providing a flashover event signal whenever a pair of signals representative of the sensed amplitude and/or phase of said magnetic fields about the upstream and downstream sides of a particular transmission tower differ, said event signal identifying the tower within the transmission system on which insulator flashover has occurred.

4. The insulator flashover identifying method of claim 3, wherein said event signal providing step includes providing a visual flag signaling the tower on which insulator flashover has occurred.

5. The insulator flashover identifying method of claim 3, wherein said transmission system comprises a three-phase power transmission system and wherein said towers transversely support a plurality of live transmission lines and said method includes sensing the amplitude and/or phase of the total magnetic field about the live lines on both the in-coming (upstream) and out-going (downstream) sides of each tower and providing signals representative of said magnetic field amplitudes and/or phases about each tower for use in said comparing step.

6. A detector for identifying flashover of an insulator within a power transmission system including at least one live transmission line transversely supported by at least one transmission tower and an insulator interposed between said line and said tower at each place of support, said detector comprising:
   means for sensing the amplitude and/or phase of the magnetic field about the at least one live transmission line upstream from said tower about an in-coming portion of said live line and downstream from said tower about an out-going portion of said live line and for providing signals representative of said sensed magnetic field amplitudes and/or phases; and
   means for comparing said signals representative of said magnetic fields upstream and downstream from the transmission tower and for providing a flashover event signal whenever said compared signals representative of the amplitudes and/or phases of said magnetic fields differ, said event signal being characteristic of insulator flashover on the transmission tower transversely supporting said at least one live transmission line.

7. The flashover detector of claim 6, wherein said magnetic field sensing means includes two magnetic field sensors, one of said sensors being located on the upstream side of the transmission tower adjacent the in-coming portion of said live line and the other of said sensors being located on the downstream side of the transmission tower adjacent the out-going portion of said live line, said sensors including means for outputting said signals representative of the amplitudes and/or phases of said magnetic fields about the upstream and downstream sides of said tower.

8. The flashover detector of claim 7, wherein said at least one live transmission line is transversely supported by a plurality of transmission towers and said magnetic field sensors are positioned upstream and downstream of each of said transmission towers.

9. The flashover detector of claim 8, wherein a plurality of live transmission lines are supported by said towers and said sensors sense the total magnetic fields about said live lines upstream and downstream of each tower.

10. The flashover detector of claim 6, wherein said sensing means provides signals representative of the amplitude of said sensed magnetic fields and said comparing means includes:
    a differential amplifier configured to receive as inputs said signals representative of the amplitudes of said magnetic fields about the live line on the upstream and downstream sides of the at least one tower and to output a signal proportional to the difference between said input signals; and
    a comparator configured to receive the output of said differential amplifier and compare it with a reference signal, said reference signal being selected such that an output from the differential amplifier in excess of said reference signal is indicative of insulator flashover on the at least one transmission tower.

11. The flashover detector of claim 10, wherein said flashover event signal includes a visual flag positioned so as to signal the tower on which insulator flashover has occurred.

12. The flashover detector of claim 11, wherein said visual signal is produced by a magnetic disk indicator.

13. The flashover detector of claim 12, wherein the output signal from said comparator determines whether said magnetic disk indicator provides said visual flag indicative of insulator flashover on the at least one transmission tower.

14. The flashover detector of claim 13, wherein said at least one live transmission line is transversely supported by a plurality of transmission towers, each of said towers including said sensing means and said comparing means.

15. The flashover detector of claim 10, wherein said flashover event signal includes an electronic signaling device which when activated identifies the occurrence of insulator flashover on the at least one transmission tower.

* * * * *